United States Patent [19]

Endo et al.

[11] Patent Number: 4,924,281

[45] Date of Patent: May 8, 1990

[54] GATE STRUCTURE FOR A MOS FET

[75] Inventors: Kazuo Endo, Yokohama; Noboru Noda, Kawasaki; Tatsuro Mitani, Tokyo, all of Japan

[73] Assignee: Kabushiki Kaisha Toshiba, Kawasaki, Japan

[21] Appl. No.: 27,131

[22] Filed: Mar. 16, 1987

Related U.S. Application Data

[63] Continuation of Ser. No. 804,452, Dec. 4, 1985, abandoned.

[30] Foreign Application Priority Data

Dec. 5, 1984 [JP] Japan ................. 59-256939

[51] Int. Cl.$^5$ ............................. H01L 29/78
[52] U.S. Cl. .................. 357/23.9; 357/23.1; 357/59; 357/67; 357/71
[58] Field of Search ............ 357/23.1, 23.9, 675, 357/71 S, 59 I

[56] References Cited

U.S. PATENT DOCUMENTS

| 4,263,058 | 4/1981 | Brown et al. | 357/71 |
|---|---|---|---|
| 4,337,476 | 6/1982 | Fraser | 357/67 S |
| 4,485,550 | 12/1984 | Koeneke et al. | 357/67 S |
| 4,581,627 | 4/1986 | Ueda et al. | 357/71 S |

OTHER PUBLICATIONS

Murarka et al.—IEEE Jour. Solid–State Circuits, vol. SC-15, No. 4, Aug. 1980, "Refractory Silicides of titanium and Tantalum for Low-Resistivity Gates and Intercorrects".

Primary Examiner—Edward J. Wojciechowicz
Attorney, Agent, or Firm—Finnegan, Henderson, Farabow, Garrett and Dunner

[57] ABSTRACT

A gate structure of a MOS FET has an oxide layer and an electrode layer sequentially formed on a silicon substrate. In the gate structure, the electrode layer includes a first silicidized high-melting metal layer formed on the oxide layer, a high-melting metal layer formed on the first silicidized high-melting metal layer and a second silicidized high-melting metal layer formed on the high-melting metal layer.

5 Claims, 2 Drawing Sheets

GATE STRUCTURE FOR A MOS FET

This application is a continuation of application Ser. No. 804,452, filed Dec. 4, 1985, now abandoned.

BACKGROUND OF THE INVENTION

The present invention relates to a gate structure of a MOS type field effect transistor (FET).

A MOS FET has an oxide layer on a silicon substrate thereof, and a gate electrode on the oxide layer. A conventional gate electrode is formed of, e.g., polycrystalline silicon resistant to high-temperature treatment. In this case, the gate electrode has relatively high resistivity, which degrades the frequency characteristics of the MOS FET. In other words, with the conventional MOS FET structure, high power gain cannot be obtained within the high-frequency band above the VHF band.

SUMMARY OF THE INVENTION

It is an object of the present invention to provide a gate structure of a MOS FET which enables manufacture of a MOS FET having excellent frequency characteristics and a high manufacturing yield.

According to the present invention, there is provided a gate structure of a MOS FET, comprising an oxide layer formed on a silicon substrate; a first silicidized high-melting metal layer formed on the oxide layer; a high-melting metal layer formed on the first silicidized high-melting metal layer; and a second silicidized high-melting metal layer formed on the high-melting metal layer, the second silicidized high-melting metal layer acting as a gate electrode together with the high-melting metal layer and the first silicidized high-melting metal layer.

DETAILED DESCRIPTION OF THE PREFERRED EMBODIMENTS

Figure 1:
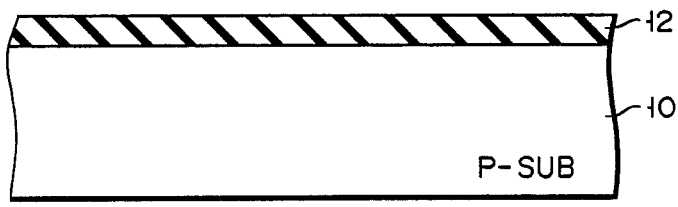
FIGS. 1 to 7 show manufacturing steps of a MOS FET according to a first embodiment of the present invention.
Figure 2:
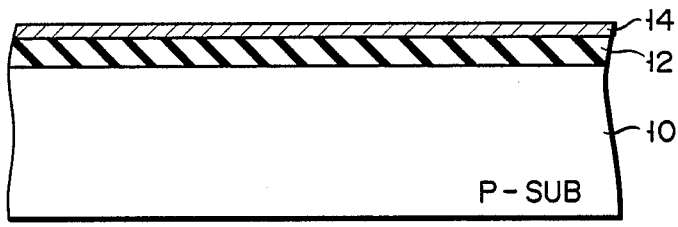
Figure 3:
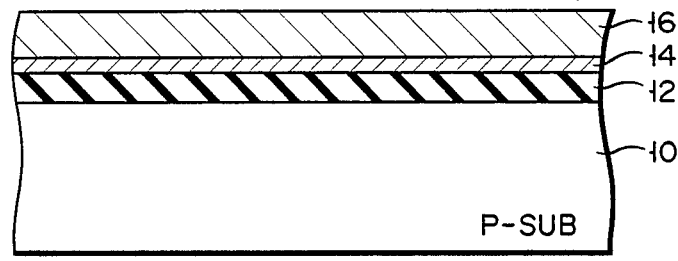
Figure 4:
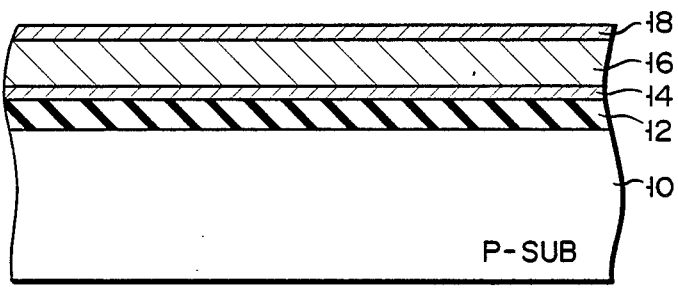

A MOS FET according to a first embodiment of the present invention will be described with reference to FIGS. 1 to 7. FIG. 1 shows a first manufacturing step of the MOS FET. In the first step, a semiconductor substrate, for example, a p-type silicon substrate 10 is prepared. An insulating ($SiO_2$) film 12 of a predetermined thickness is formed on the substrate 10 by thermal oxidation. In the step of FIG. 2, a molybdenum silicide ($MoSi_2$) layer 14 is formed on the film 12 by sputtering. In the step of FIG. 3, a molybdenum (Mo) layer 16 is formed on the layer 14 by sputtering. In the step of FIG. 4, a molybdenum silicide ($MoSi_2$) layer 18 is formed on the layer 16 by sputtering.

Figure 5:
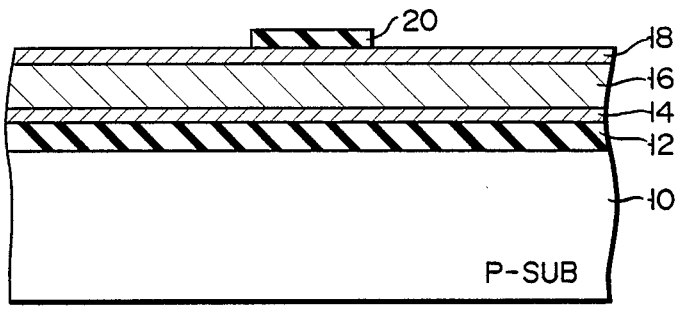
Figure 6:
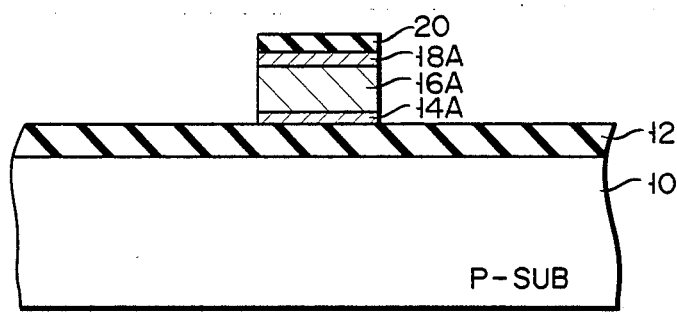
Figure 7:
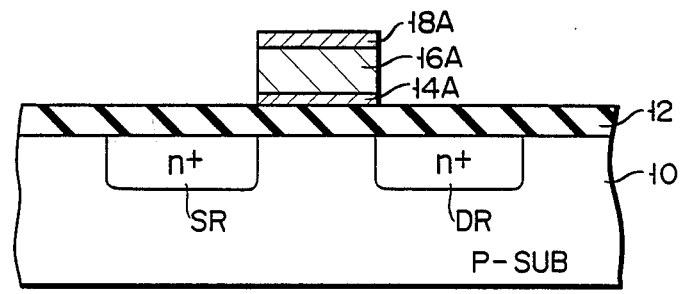

After the step of FIG. 4, a resist film 20 shown in FIG. 5 is formed on the layer 18. The film 20 is used as a mask pattern for forming a gate electrode of the MOS FET. In the step of FIG. 6, the layers 14, 16 and 18 are partially removed by etching using the film 20 as a mask, and layers 14A, 16A and 18A shown in FIG. 6 are left. The layers 14A, 16A and 18A are used as the gate electrode of the MOS FET. In the step of FIG. 7, source and drain regions SR and DR of $n^+$-type conductivity are formed in the surface area of the substrate 10 by the ion-implantation and annealing process using the gate electrode as a mask. Then film 20 is removed, thereby completing the enhancement type MOS FET.

An exposed portion of the MOS FET is covered by a protective film (not shown) for stable operation after the step of FIG. 7. When the MOS FET is connected to, e.g., another MOS FET (not shown), the protective film and the film 12 are partially removed to form contact holes. Conductive layers for wiring are formed in contact with a part of the substrate 10 and the gate electrode through the contact holes. When a depletion type MOS transistor (not shown) is manufactured, n-type impurities are not doped in the substrate 10 so as to form the regions SR and DR in the step of FIG. 7. Note that the $MoSi_2$ layers 14A and 18A are formed sufficiently thinner than the Mo layer 16A.

In the first embodiment, a high-melting material such as molybdenum or molybdenum silicide is used as a material of the gate electrode of the MOS FET. Therefore, even if high-temperature treatment is applied to the MOS FET after the step of FIG. 7, element characteristics are not degraded very much.

In the MOS FET of this type, the layer 14A is in contact with the film 12. Molybdenum silicide has a higher bonding strength with silicon oxide than polycrystalline silicon. Therefore, the gate electrode of the MOS FET of this type is not easily peeled from the film 12.

Particularly, in the first embodiment, the layer 16A is formed between the relatively thin layers 14A and 18A. Molybdenum has a low resistivity, i.e., 1/5 to 1/10 of that of molybdenum silicide. Therefore, the resistivity of the entire gate electrode is decreased compared to a conventional case.

When etching is performed for forming contact holes as described above, a solvent such as hydrofluoric acid (HF), ammonium fluoride ($NH_4F$) and so on is usually used. The solvent of this type tends to easily react with molybdenum. However, in the present invention, the $MoSi_2$ layers 14A and 18A which do not easily react with the solvent cover upper and bottom surfaces of the layers 16A so that etching of the $MoSi_2$ layer is prevented. The layer 16A is also protected from oxidation by factors other than the solvent.

Figure 8:
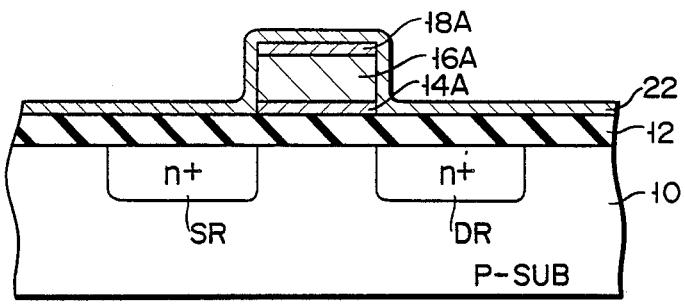
FIGS. 8 and 9 show manufacturing steps of a MOS FET according to a second embodiment of the present invention, which uses as a basic structure the MOS FET according to the first embodiment of the present invention.
Figure 9:
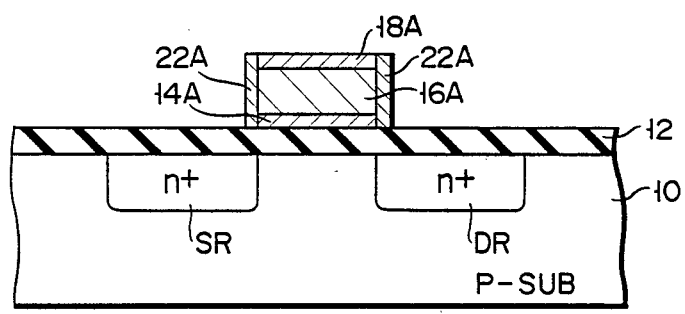

A MOS FET according to the second embodiment of the present invention will now be described with reference to FIGS. 8 and 9. The MOS FET of this type is manufactured using as a basic structure the MOS FET manufactured in the steps of FIGS. 1 to 7. More particularly, after the step of FIG. 7, a $MoSi_2$ layer 22 shown in FIG. 8 is formed by sputtering. The layer 22 covers an entire surface of the exposed portions of the layers 12, 14A, 18A and 16A. Thereafter, the layer 22 is subjected to reactive ion etching. A $MoSi_2$ layer 22A is partially left as shown in FIG. 9 by this anisotropic etching. Then, the layers 14A, 18A and 22A together with the layer 14 form the gate electrode of the MOS FET. In this case, the layer 16A is completely covered with the layers 14A, 18A and 22A. Therefore, the chemical resistance and the oxidation resistance of the gate electrode of the MOS FET are improved over those of the MOS FET of the first embodiment.

Finally, with the gate structure according to the present invention, a MOS FET having excellent high-frequency characteristics can be manufactured with high manufacturing yield.

In the embodiments described above, the MoSi$_2$ layers 14A, 18A and 22A are used as high-melting silicide layers. However, the layers 14A, 18A and 22A may be titanium silicide or molybdenum silicide layers having different composition ratios.

What is claimed is:

1. A gate structure for an insulated gate type FET, comprising:
    a substrate;
    a silicon oxide layer formed on said substrate; and
    a gate electrode formed on said silicon oxide layer, said gate electrode including a high-melting metal layer and first and second silicidized, high-melting metal layers each thinner than said high-melting metal layer, said first silicidized, high-melting metal layer being formed on said silicon oxide layer, with said high-melting metal layer being formed between respective upper and bottom surfaces of said first and second silicidized, high-melting metal layers, and side surfaces of said high-melting metal layer being in alignment with corresponding side surfaces of said first and second silicidized, high-melting metal layers.

2. A gate structure according to claim 1, wherein said first and second silicidized, high-melting metal layers are formed of a molybdenum silicide.

3. A gate structure according to claim 1, wherein said first and second silicidized, high-melting metal layers are formed of a titanium silicide.

4. A gate structure according to claim !, wherein said first and second silicidized, high-melting metal layers respectively contact entire bottom and upper surfaces of said high-melting metal layer.

5. A gate electrode according to claim 4, wherein a third silicidized, high-melting metal layer covers entire side surfaces of said high-melting metal layer.

* * * * *